(12) United States Patent
Ecton et al.

(10) Patent No.: US 11,373,951 B2
(45) Date of Patent: Jun. 28, 2022

(54) VIA STRUCTURES HAVING TAPERED PROFILES FOR EMBEDDED INTERCONNECT BRIDGE SUBSTRATES

(71) Applicant: INTEL CORPORATION, Santa Clara, CA (US)

(72) Inventors: Jeremy D. Ecton, Gilbert, AZ (US); Hiroki Tanaka, Chandler, AZ (US); Oscar Ojeda, Chandler, AZ (US); Arnab Roy, Chandler, AZ (US); Vahidreza Parichehreh, Gilbert, AZ (US); Leonel R. Arana, Phoenix, AZ (US); Chung Kwang Tan, Chandler, AZ (US); Robert A. May, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 927 days.

(21) Appl. No.: 15/937,645

(22) Filed: Mar. 27, 2018

(65) Prior Publication Data
US 2019/0304912 A1   Oct. 3, 2019

(51) Int. Cl.
*H01L 23/538* (2006.01)
*H01L 21/48* (2006.01)

(52) U.S. Cl.
CPC ...... *H01L 23/5381* (2013.01); *H01L 21/4853* (2013.01); *H01L 21/4857* (2013.01); *H01L 23/5383* (2013.01); *H01L 23/5386* (2013.01)

(58) Field of Classification Search
CPC ............. H01L 23/5381; H01L 23/5386; H01L 23/5384; H01L 2225/06548; H01L 23/5226; H01L 2224/24135–24137; H01L 25/0655; H01L 23/5383; H01L 23/49822
See application file for complete search history.

(56) References Cited

U.S. PATENT DOCUMENTS

2015/0116965 A1*  4/2015  Kim .................... H01L 23/5385
                                                                 361/767

\* cited by examiner

*Primary Examiner* — Amar Movva
(74) *Attorney, Agent, or Firm* — Schwabe, Williamson & Wyatt, P.C.

(57) ABSTRACT

Embodiments include a package structure with one or more layers of dielectric material, where an interconnect bridge substrate is embedded within the dielectric material. One or more via structures are on a first surface of the embedded substrate, where individual ones of the via structures comprise a conductive material and have a tapered profile. The conductive material is also on a sidewall of the embedded substrate.

17 Claims, 13 Drawing Sheets

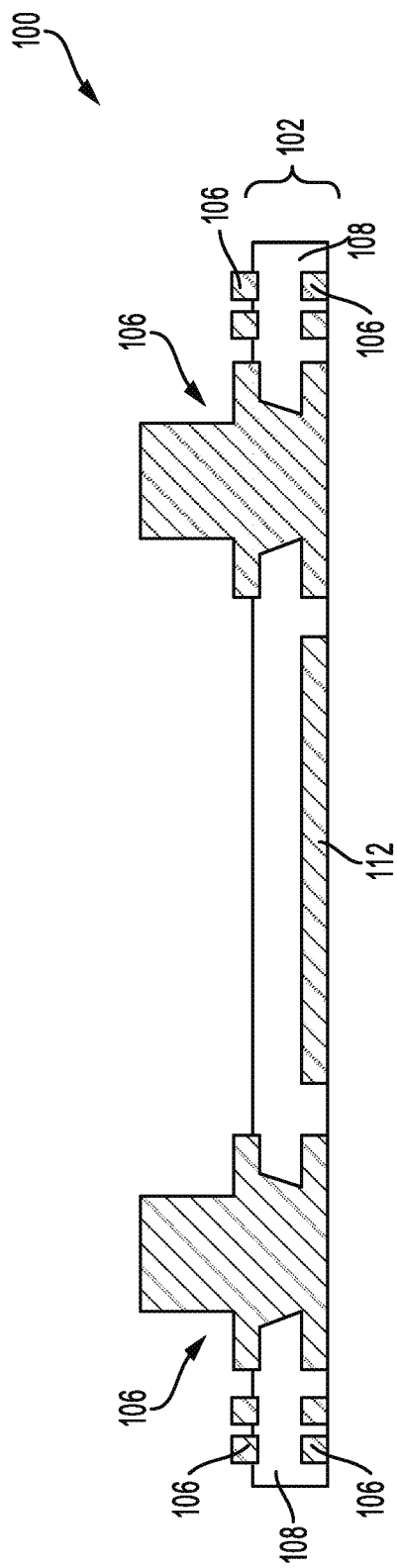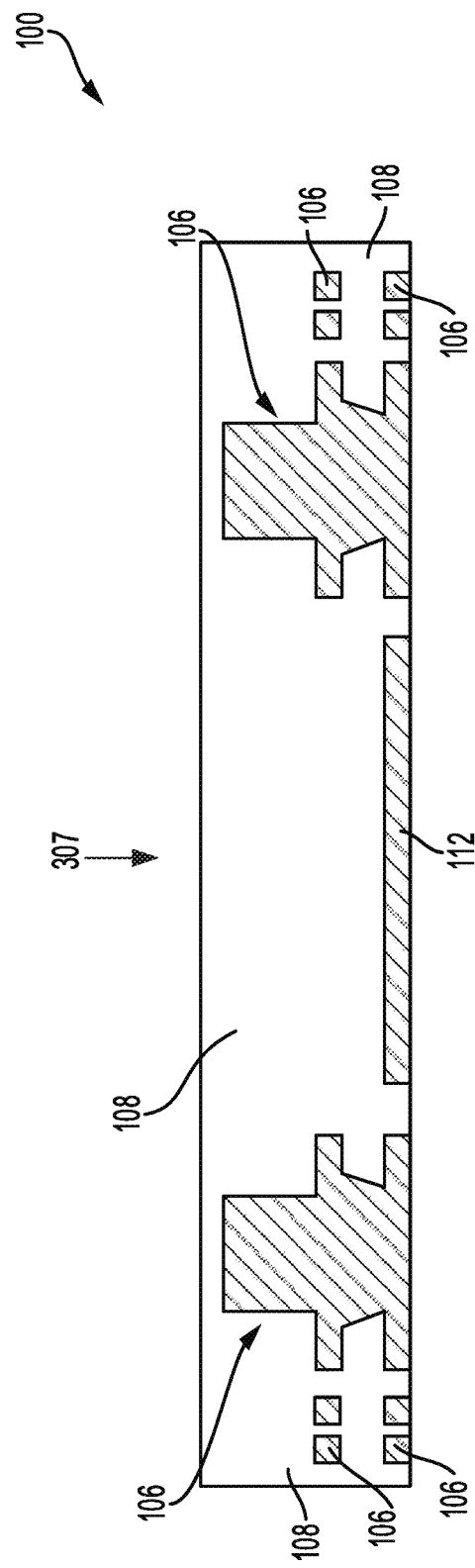

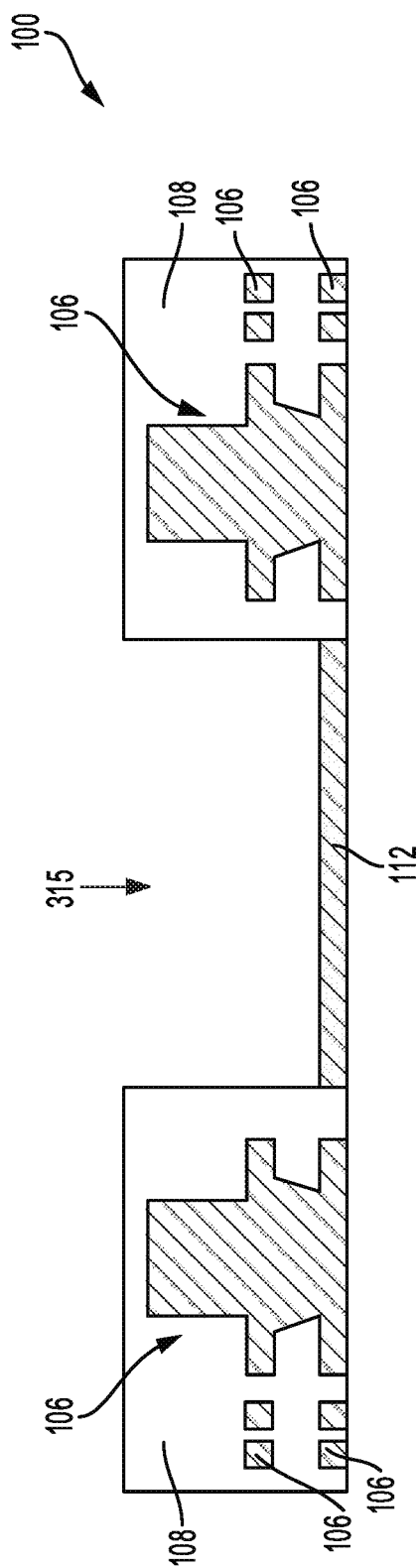
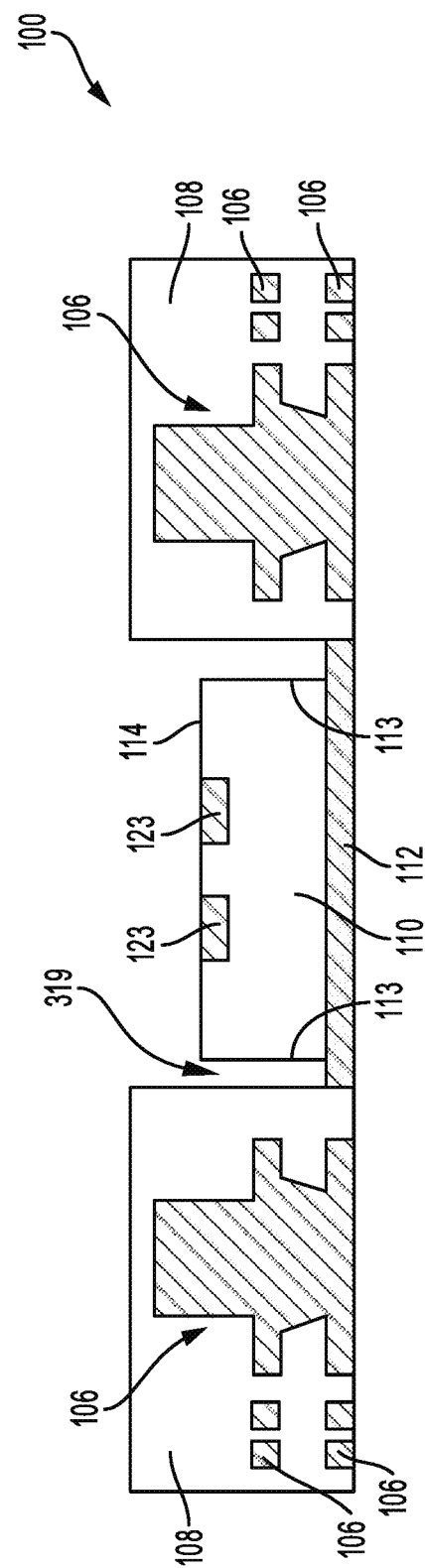

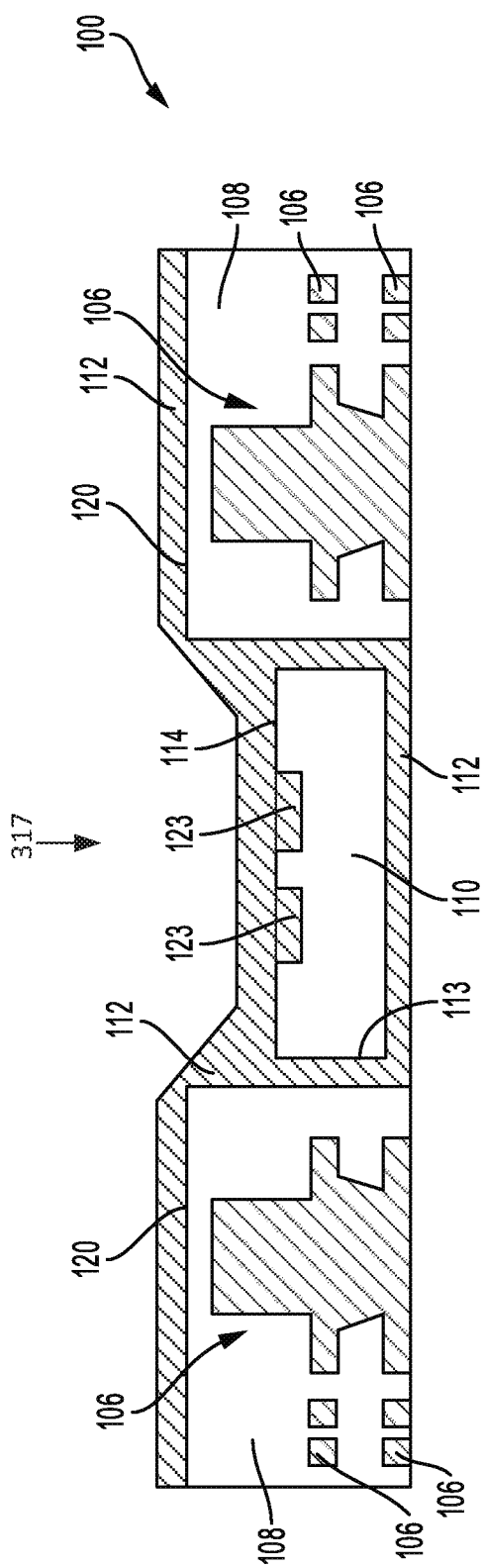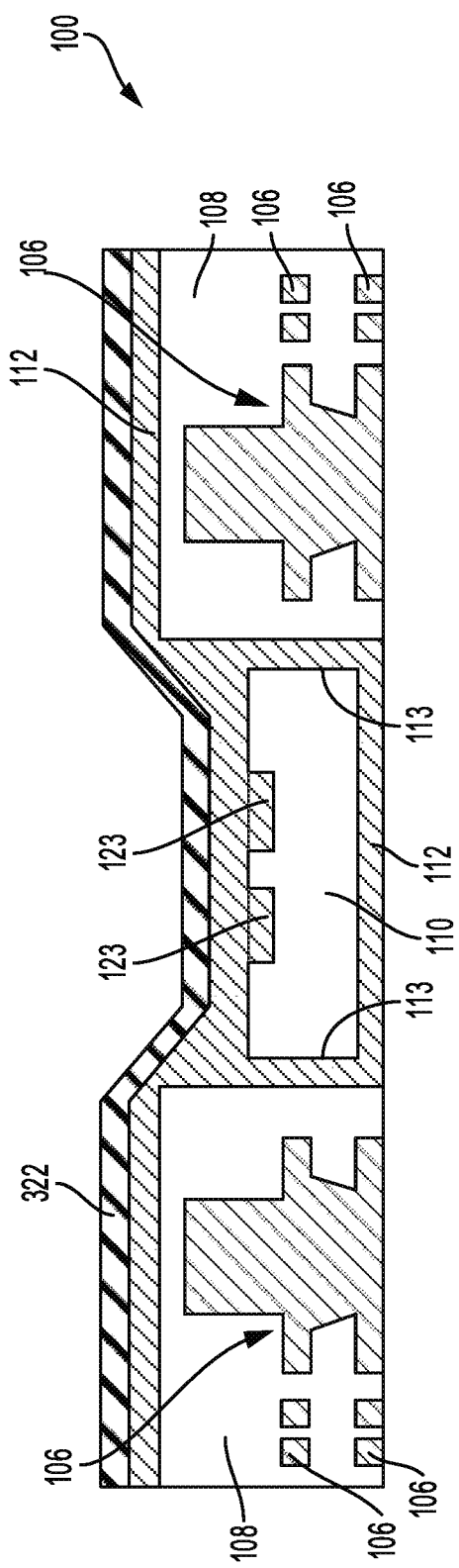

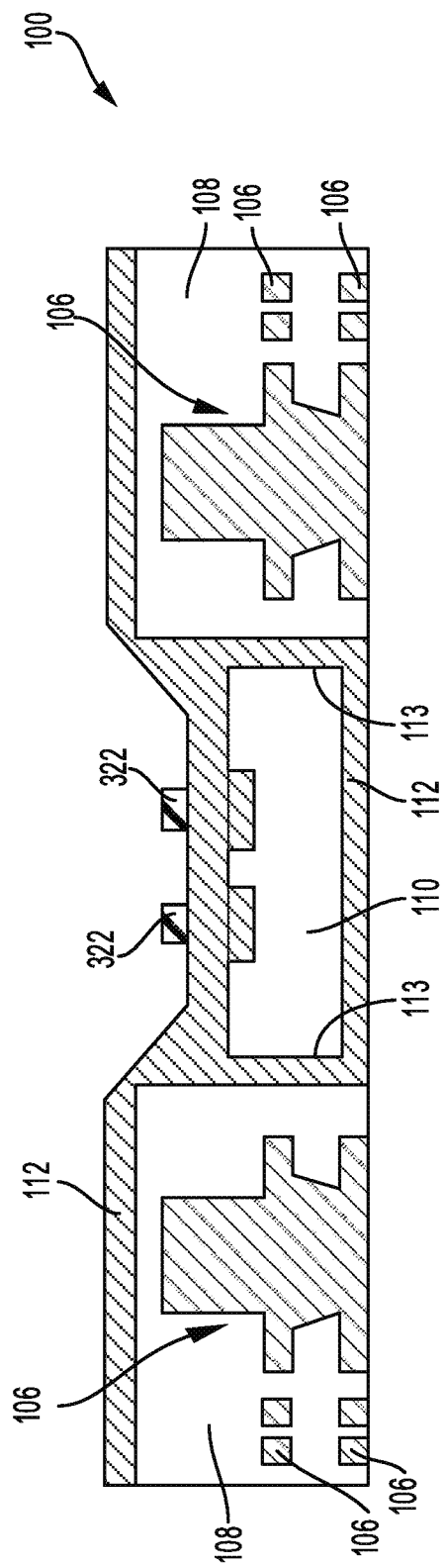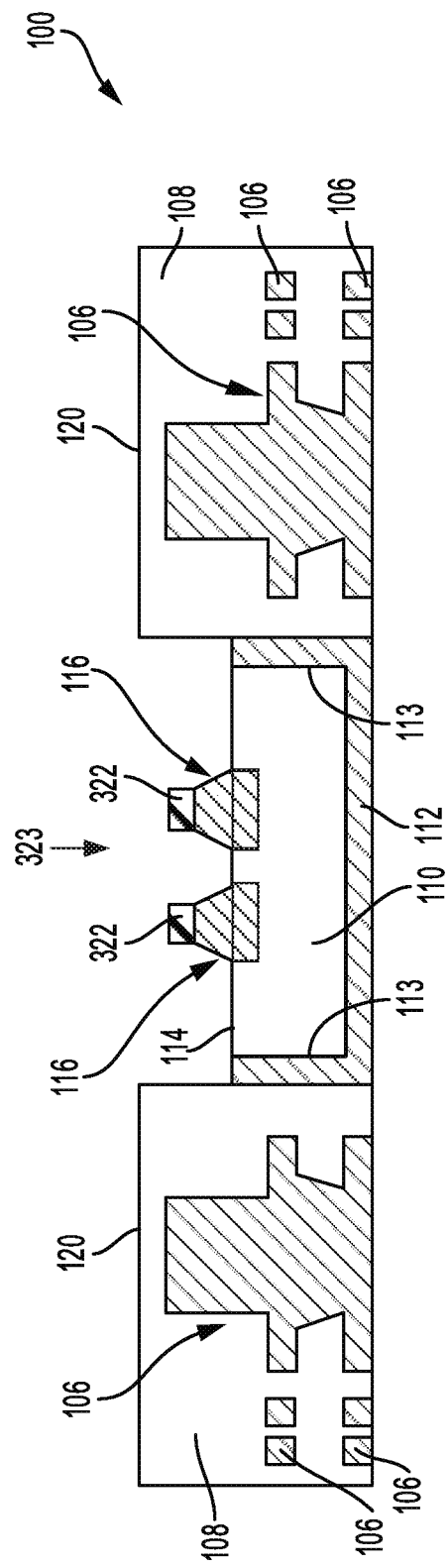

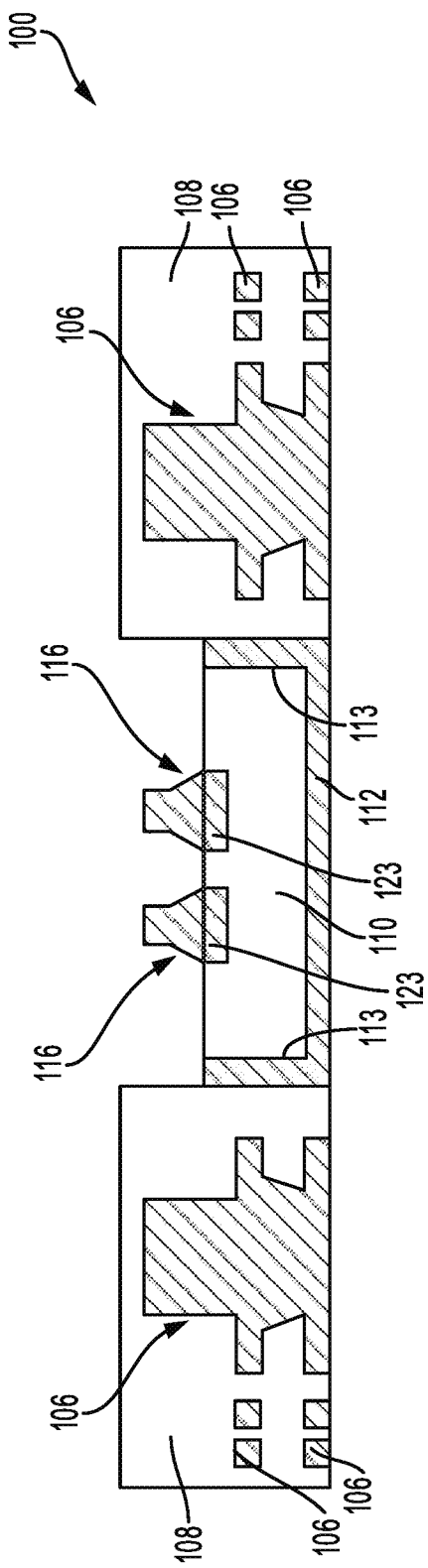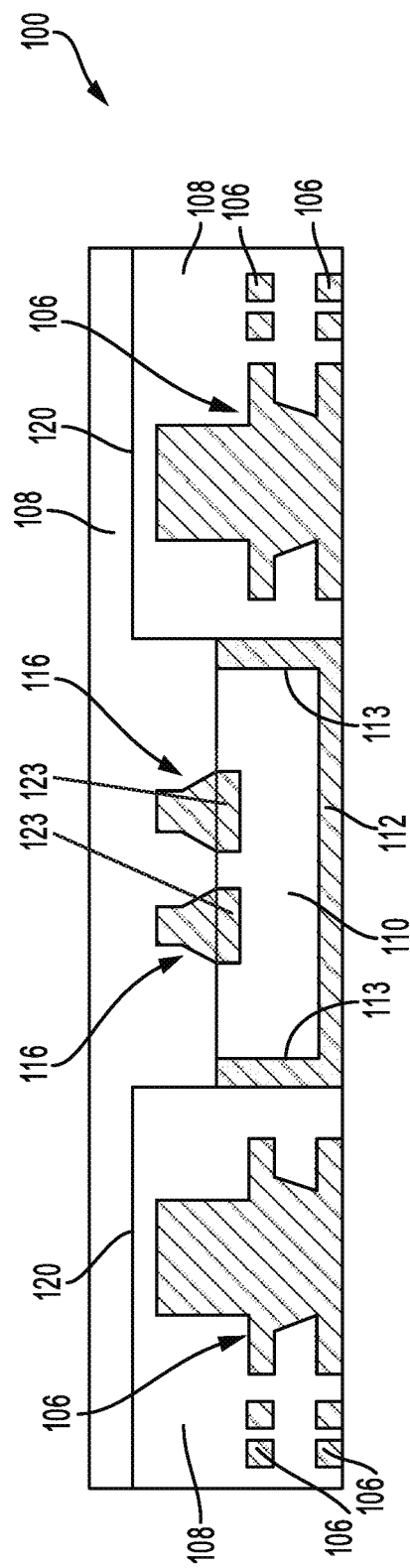

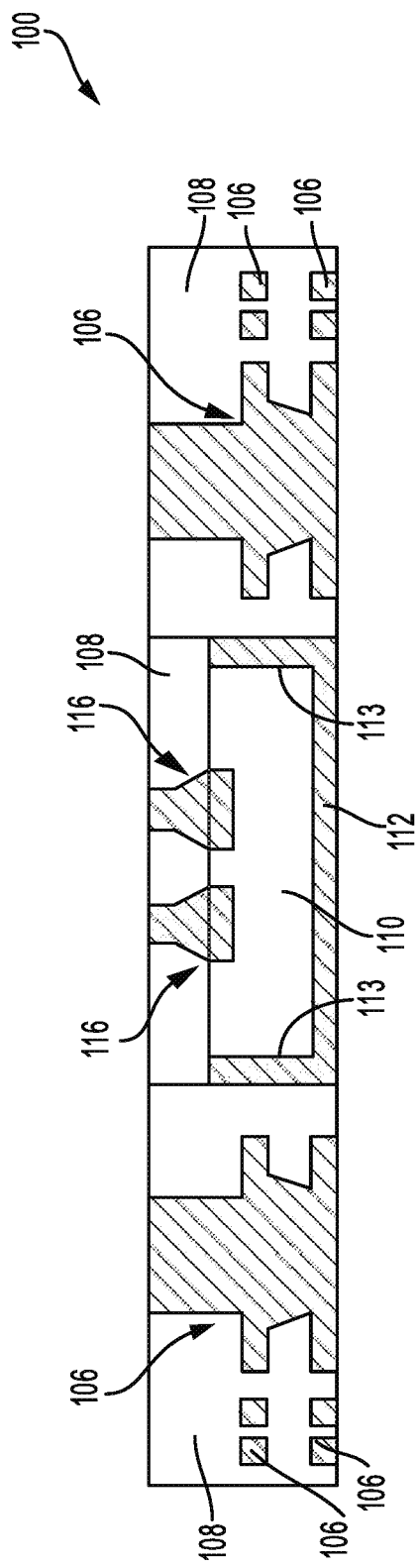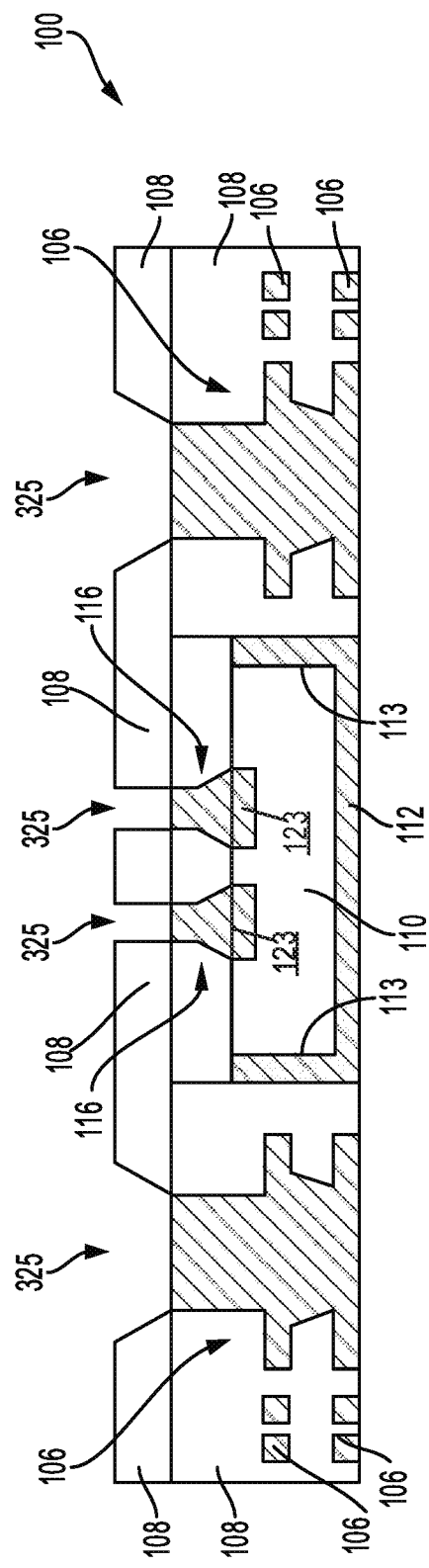

VIA STRUCTURES HAVING TAPERED PROFILES FOR EMBEDDED INTERCONNECT BRIDGE SUBSTRATES

TECHNICAL FIELD

Embodiments of the present description generally relate to the field of microelectronic packaging, and, more particularly, to microelectronic packages having interconnect bridges embedded within package substrates.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like.

One way to achieve these goals is by increasing the number of die to die connections within a multi die package structure. Some solutions have utilized silicon interposer structures and through silicon via (TSV) structures with which to achieve die to die connections. However, the use of embedded interconnect bridges allows for the elimination of TSV's, and enables extremely high input/output interconnect paths between multiple die on a package substrate.

One challenge with the use of embedded interconnect bridge structures is meeting lithographic resolution and overlay requirements for features possessing extremely small geometries. For example, lithographically patterning vias on the embedded interconnect bridge surface may possess geometries of 10 microns or less.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 3A-3M illustrate cross-sectional views of subtractive etch via structures, according to embodiments.

DETAILED DESCRIPTION

Figure 1A:
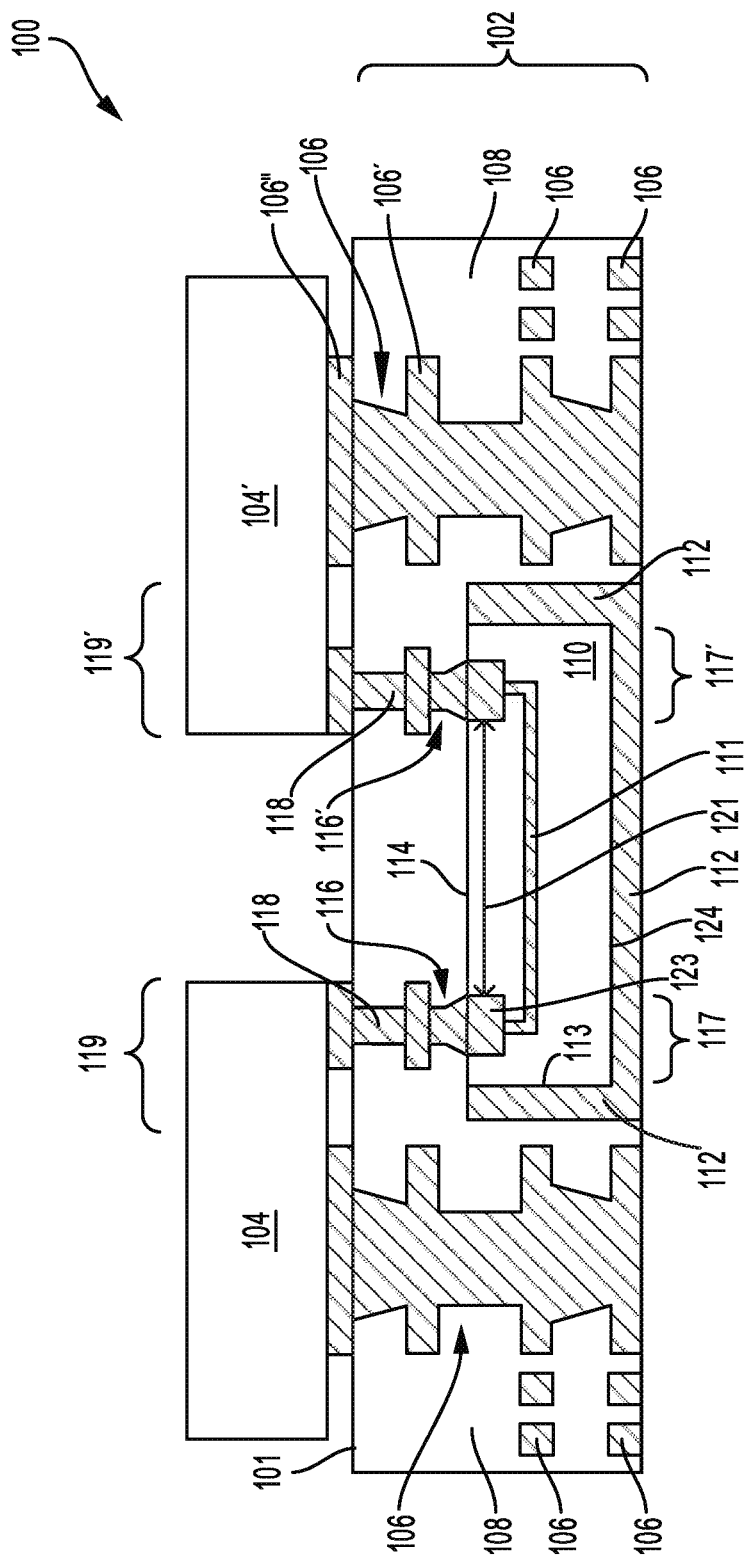
FIGS. 1A-1C illustrates a cross-sectional view of a package structure with subtractive etch via structures, according to embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "circuit" or "module" may refer to one or more passive and/or active components that are arranged to cooperate with one another to provide a desired function. The term "signal" may refer to at least one current signal, voltage signal, or magnetic signal. The terms "substantially", "close", "approximately", "near", and "about" generally refer to being within +/−10 percent of a target value.

Various implementations of the embodiments herein may be formed or carried out on a substrate, such as a package substrate. In some embodiments, a package substrate may comprise any suitable type of substrate capable of providing electrical communications between an electrical component, such as an integrated circuit (IC) die, and a next-level component to which an IC package may be coupled (such as a circuit board, for example). In other embodiments, the substrate may comprise any suitable type of substrate capable of providing electrical communication between an IC die and an upper IC package coupled with a lower IC/die package, and in some embodiments, a substrate may comprise any suitable type of substrate capable of providing electrical communication between an upper IC package and a next-level component to which an IC package is coupled.

A substrate may also provide structural support for a device, such as a die. By way of example, in some embodiments, a substrate may comprise a multi-layer substrate—including alternating layers of a dielectric material and metal—built-up around a core layer (either a dielectric or a metal core), and may include through via structures that extend through the core. In other embodiments, a substrate may comprise a coreless multi-layer substrate, in which case through via structures are absent. Other types of substrates and substrate materials may also find use with the disclosed embodiments (e.g., ceramics, sapphire, glass, etc.). Further, according to some embodiments, a substrate may comprise alternating layers of dielectric material and metal that are built-up over a die itself—this process is sometimes referred to as a "bump-less build-up process." Where such an approach is utilized, conductive interconnects may or may not be needed (as the build-up layers may be disposed directly over a die/device, in some cases).

A die may include a front-side and an opposing back-side, and may be an integrated circuit die and/or an integrated circuit device, in some embodiments. In some embodiments, the front-side may be referred to as the "active surface" of the die. A number of interconnects may extend from the die's front-side to an underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some embodiments, a die may be disposed on a substrate in a flip-chip arrangement. In some embodiments, interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be on the terminals of a substrate and/or die, and these terminals may then be joined using a solder reflow process, for example. Of course, it should be understood that many other types of interconnects and materials are possible (e.g., wirebonds extending between a die and a substrate). In some embodiments herein, a die may be coupled with a substrate by a number of interconnects in a flip-chip arrangement. However, in other embodiments, alternative structures and/or methods may be utilized to couple a die with a substrate.

Described herein are packaging structures that include an embedded interconnect bridge, where a surface of the embedded interconnect bridge has one or more via structures thereon. The via structures are formed by utilizing a subtractive etch lithographic technique, where masking material is patterned on a conductive material to form the via structures. The via structures have a tapered profile characteristic of a subtractive etch process. The via structures provide a space to thickness ratio of greater than 2:1, in some cases. The via structures described herein may have diameters of 10 microns or less. The via structures produced by the subtractive etch process herein may have a tapered profile, where a top and a middle portion of the via structure may be narrower than a bottom portion of the tapered via, in some embodiments. In some embodiments, the via structure has an hourglass profile in a cross-sectional view. The via structures described herein enable smaller dimensioned interconnect vias for use in package structures incorporating embedded multi-die interconnect bridge structures (EMIB).

Embodiments include an interconnect bridge structure/substrate embedded within one or more layers of dielectric material. The one or more dielectric layers may be included in a portion of a package structure. The dielectric material may include layers of metal adjacent to the interconnect bridge structure. Tapered via structures are on a top surface of the interconnect bridge structure, and are physically and electrically coupled to interconnect structures, such as conductive vias of a first level metallization layer, that are overlaying the via structures, in some embodiments.

FIG. 1A is a cross-sectional view of a package structure 100, arranged in accordance with some embodiments of the present disclosure. Package structure 100 may include a substrate 102, and one or more devices 104, 104' mounted on or otherwise coupled to the substrate 102. The package structure 100 may also include an interconnect bridge 110 embedded in the substrate 102 to electrically couple the first device 104 to the second device 104', for example, and may route electrical signals between the devices 104, 104'. The interconnect bridge 110 is an embedded multi-die interconnect bridge, in an embodiment.

In some embodiments, the embedded interconnect bridge structure 110 may comprise an embedded silicon bridge die with one or more routing layers with which to electrically couple multiple die to each other. In some embodiments, the substrate 102 may include any number of embedded interconnect bridge structures. In some embodiments, the embedded interconnect bridge structure 110 may comprise one or more input/output (I/O) electrical paths, such as one or more of the routing structure 111, within the embedded interconnect bridge structure, for electrical communication between the devices 104, 104'. The routing structure 111 may comprise conductive material such as copper or copper alloys, nickel, silver, aluminum, zinc or gold. Any number of devices may be electrically coupled to each other by the embedded interconnect bridge 110.

In some embodiments, the devices 104, 104' may comprise any type of device or component that may be included within an electronic device package, such as an integrated circuit device. In some embodiments, the devices 104, 104' include a processing system (either single core or multi-core). For example, the devices 104, 104' may comprise a microprocessor, a graphics processor, a signal processor, a network processor, a chipset, a memory device etc. In some embodiments, the devices 104, 104' comprise a system-on-chip (SoC) having multiple functional units (e.g., one or more processing units, one or more graphics units, one or more communications units, one or more signal processing units, one or more security units, etc.).

The devices 104, 104' are attached to the substrate 102 according to a variety of suitable configurations including a flip chip configuration, a wire bonding configuration, or any other suitable attachment configuration. In the flip chip configuration, active sides of the devices 104, 104' are attached to a first side 101 of the substrate 102 using interconnect structures (not shown) such as bumps or pillars, which serve to route electrical signals, such as I/O, power and/or ground signals, associated with the operation of the devices 104, 104'. In some embodiments, the wire bonding or the flip chip connections may comprise conductive materials such as copper, gold and nickel.

The substrate 102 includes conductive interconnect structures/routing layers 106 that are within dielectric layer(s) 108, which may be configured to route electrical signals between the devices 104, 104'. For example, in some embodiments, the interconnect structures 106 may include routing structures such as pads or traces configured to receive electrical signals to and from the devices 104, 104'. In some embodiments, individual ones of the conductive interconnect structures/layers 106 comprise trenches, ground planes, power planes, re-distribution layers (RDLs), and/or any other appropriate electrical routing features. Although specific patterns of the conductive interconnect structures/layers 106 are illustrated in FIG. 1A, such patterns are merely an example. In some embodiments, the routing layers 106 may comprise conductive materials such as copper, gold and nickel.

The dielectric layers 108 and the conductive layers/structures 106 are sometimes referred to as a "package substrate", and may comprise any suitable type of substrate capable of providing electrical communications between devices/components on/within the package substrate 102 (such as devices 104, 104'), and a next-level component to which the package substrate 102 is coupled (e.g., a circuit board), in some embodiments. The substrate 102 may also provide structural support for the devices 104, 104'.

In some embodiments, the substrate 102 may comprise a multi-layer substrate—including alternating layers of a dielectric material and metal—built-up around a core layer (either a dielectric or metal core). In some embodiments, the substrate 102 may comprise a coreless multi-layer substrate. Other types of substrates and substrate materials may also find use with the disclosed embodiments (e.g., ceramics, sapphire, glass, etc.). The substrate 102 may be any substrate known to be suitable for one or more of flip-chip packages (FCBGA), package-on-package (PoP), system-in-package (SiP), or the like. The substrate 102 may further include interconnect structures (not shown) such as solder balls, on a second side, opposite the first side 101 of the substrate 101, which may couple the package structure 100 to a motherboard, or any other suitable type of board, for example.

In an embodiment, the embedded interconnect bridge structure 110 is embedded within the package substrate 102 such that peripheral portions 119, 119" of the devices 104, 104' footprint (lateral width) overlay peripheral portions 117, 117' of the embedded interconnect bridge 110 footprint respectively. In an embodiment, a center portion 121 of the embedded interconnect bridge 110 is between the peripheral portions 119, 119' of the devices 104, 104', and the die 104, 104' are not over the center portion 121 of the embedded interconnect bridge 110.

One or more subtractive etch patterned lithography (SEL) via structures 116 are on a first side 114 of the embedded interconnect structure 110. The SEL via structures 116 may comprise a conductive material, such as copper or copper alloys, nickel, silver, aluminum, zinc or gold, for example, and may comprise a tapered interconnect structure. In some embodiments, individual ones of the SEL via structures 116 are on pads 123 disposed on and partially within the embedded interconnect structure 110. The pads 123 may comprise any conductive material, such as copper, copper alloys, nickel, silver, aluminum, zinc or gold, for example.

The one or more SEL via structures 116 may comprise a tapered profile (to be described in greater detail further herein). In some embodiments, the tapered profile resembles an hour glass profile, where top and bottom portions of individual ones of the SEL via structure 116 have a greater lateral width than a lateral width of a middle portion. In some embodiments, a bottom portion of individual ones of the SEL vias 116 has a greater lateral width than lateral widths of top and middle portions.

In some embodiments, the one or more SEL via structures 116 may be physically and electrically coupled with a first level of interconnect metallization 106'. In some embodiments, individual ones of one or more first level interconnect (FLI) vias 118, may be on and electrically coupled with individual ones of the SEL via structure 116. In some embodiments, the FLI vias 118 may comprise conductive materials such as copper or copper alloys, nickel, silver, aluminum, zinc or gold. In some embodiments, one or more FLI vias 118 may be coupled with a second level of interconnect metallization 106" that is overlaying the first level of interconnect metallization 106'.

The FLI vias 118 may or may not comprise a tapered profile. In an embodiment where the FLI via 118 comprises a taper, the taper of the FLI via 118 resembles a "V" shape (to be further described herein). In other words, a top portion of the FLI via 118 has a greater lateral width than a lateral width of a bottom portion of the FLI via 118. In an embodiment, the bottom portion of the FLI via 118 is on a top portion of the SEL via structure 116. In some embodiments, individual ones of the FLI vias 118 possess a taper profile that is opposite, or a mirror image, of the taper profile of the SEL via 116. In an embodiment, the routing structure 111 electrically couples a first SEL via 116 to a second SEL via 116'. The first and second SEL vias 116, 116' may electrically couple a first die 104 to a second die 104' through the routing structures of the embedded interconnect structure 110.

In some embodiments, the embedded interconnect structure 110 comprises one or more sidewalls 113. The sidewalls 113 have a conductive material 112 disposed thereon. The conductive material 112 may comprise copper or copper alloys, nickel, silver, aluminum, zinc or gold, in some embodiments, and may comprise the same or a similar conductive material as the SEL via and the FLI via structures 116, 118. The conductive material 112 is additionally on a second side 124 of the embedded interconnect structure 110. In an embodiment, there is a portion of the dielectric material 108 between the conductive material 112 on the one or more sidewall 113, and the conductive interconnect structures 106 that are disposed within the substrate 102.

Figure 1B:
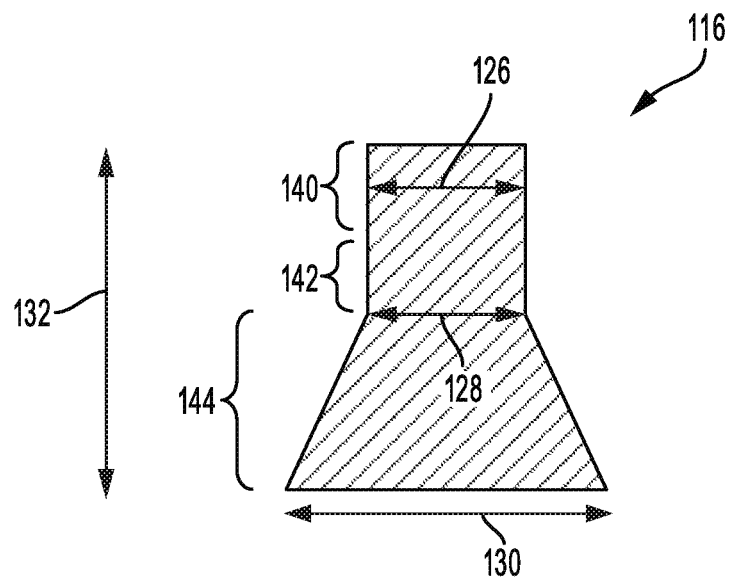
Figure 1C:
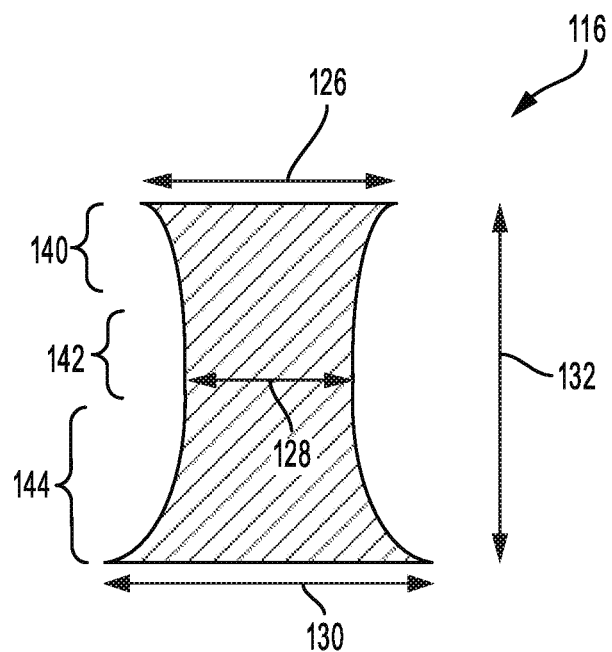

FIGS. 1B-1C illustrate cross sectional views of SEL via structures according to some embodiments. In FIG. 1B, a SEL via 116 has a first portion 140, a second portion 142 and a third portion 144. In some embodiments, the first portion 140 and the second portion 142 may comprise lateral widths 126, 128 respectively. The third portion 144 of the SEL via 116 has a lateral width 130 that is greater than the lateral widths 126, 128 of the first and second portions 140, 142. In an embodiment, the lateral width 130 of the third portion 144 of the SEL via 116 may be at least about 10 percent greater than the lateral widths 126, 128 of the first and second portions 126, 128. In FIG. 1C, a SEL via 116 is depicted, wherein the SEL via 116 may comprise an hour glass profile. In some embodiments, the lateral widths 126, 130 of the first and third portions 140, 144 of the SEL via 116 are greater than the lateral width 128 of the second portion 142. In some embodiments, the lateral widths 126, 130 of the first and third portions 140, 144 of the SEL via 116 are at least about 10 percent greater than the lateral width 128 of the second portion 142. In some embodiments, the SEL via 116 may comprise a thickness/height 132 of about 3 microns to about 20 microns.

Figure 1D:
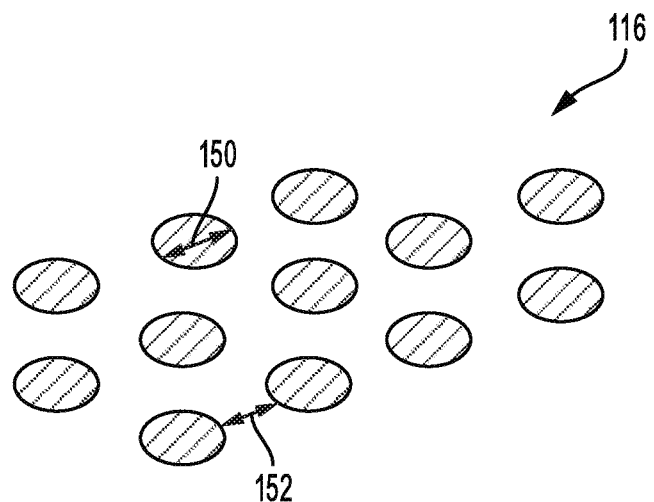
FIG. 1D illustrates a top view of a plurality of subtractive etch via structures, according embodiments.

FIG. 1D depicts a top view of a plurality of SEL via structures 116. In some embodiments, individual ones of the plurality of SEL via structures 116 comprise a diameter 150 of between about 2 microns to about 50 microns. In some embodiments, a space 152 between individual ones of the plurality of SEL via structures 116 comprises a space 152 to thickness ratio of greater than about 2:1. In other embodiments, a space 152 to thickness ratio is between about 1:1 to about 2:1. In an embodiment, the space 152 may be between about 25 to about 35 microns.

Figure 1E:
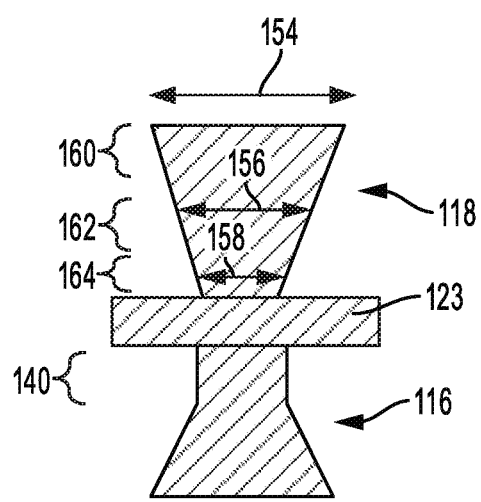
FIG. 1E illustrates a cross-sectional view of a first level interconnect via on a subtractive etch via, according embodiments.

In FIG. 1E, a cross sectional view of a FLI via 118 disposed on a SEL via 116 is depicted. The FLI via has a "V" shaped profile, where a top portion 160 of the FLI via 118 has a lateral width 154, a middle portion 162 has a lateral width 156, and a bottom portion 164 has a lateral width 158. In an embodiment, the top portion 160 lateral width 154 is larger than the middle portion 162 lateral width 156, and the middle portion 162 lateral width 156 is larger than the bottom portion 164 lateral width 158. In an embodiment, the bottom portion 164 of the FLI via 118 is on a top portion 140 of the SEL via 116. In an embodiment, a pad 123 is between the bottom portion 164 of the FLI via 118 and a top portion 140 of the SEL via 116.

Figure 2:
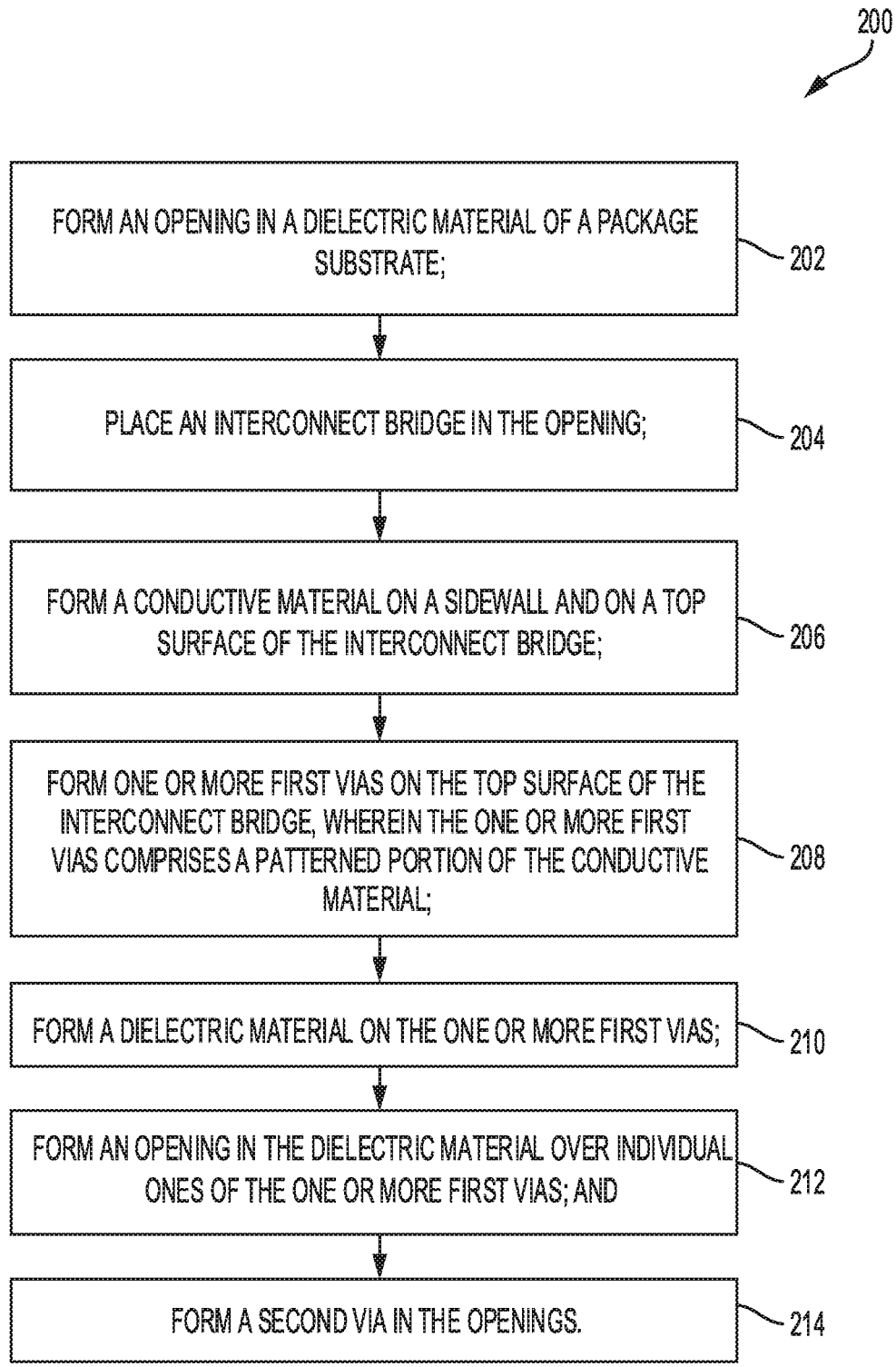
FIG. 2 is a flow diagram illustrating a method of fabricating subtractive etch via structures, according to embodiments.

FIG. 2 depicts a flow chart of methods of forming one or more SEL vias on an embedded substrate, according to embodiments. The SEL via structures described herein are fabricated by patterning a conductive material formed on a first side of the embedded substrate.

At operation 202, an opening may be formed in a dielectric material of a substrate. In an embodiment, the substrate may be a package substrate. In an embodiment, the opening may expose a conductive trace on a bottom portion of the opening. In some embodiments, the opening may be formed by utilizing a drilling process. The substrate may comprise conductive traces/routing structures, and the like, disposed within dielectric material. The dielectric material may be a laminated isolation material, or may be formed in any other suitable manner. The conductive traces disposed within the dielectric material may comprise a pillar structure, and may comprise copper, in some embodiments.

At operation 204, an interconnect bridge may be placed within the opening. In an embodiment, the interconnect bridge is an EMIB structure, and comprises a first side and a second side. In some embodiments, the interconnect bridge structure may comprise any suitable embedded interconnect structure that is capable of interconnecting multiple die to each other within the substrate. In an embodiment, the second side of the interconnect bridge is placed on a conductive trace disposed on the bottom of the opening. In an embodiment, the EMIB structure comprises one or more conductive pads on the first side, and partially within, the EMIB.

At operation 206, a conductive material may be formed on a sidewall and on the first side of the interconnect bridge. In an embodiment, the conductive material is formed within an opening between the interconnect bridge and an adjacent portion of the dielectric material. In some embodiments, the conductive material may be formed on a top surface of the adjacent dielectric material. The conductive material may be formed utilizing a sputtering process, an electrolytic plating process or an electroless plating process, in some embodiments. The conductive material may be formed to comprise a thickness of between about 3 microns to about 20 microns, in some embodiments. In some embodiments, the conductive material may comprise copper and/or copper alloys.

At operation 208, one or more first vias may be formed on the first side of the interconnect bridge. In some embodiments, the one or more first vias may be formed by initially forming a masking material, such as a dry film resist material, on a surface of the conductive material. The masking material/resist may then be patterned by using any suitable lithographic techniques. The masking material may be formed to create features, such as circular pads of about 2 microns to about 50 microns in diameter, and may be formed on/over the first side of the interconnect bridge, in some embodiments.

In an embodiment, a ratio of a spacing between individual features and a thickness of the conductive material is greater than about 2:1. In another embodiment, the spacing to thickness ratio may be about 1:1 between adjacent features. Subsequent to the formation of the patterned features, the conductive material adjacent to the patterned features may be removed by utilizing any suitable removal process, such as a wet or dry etch process, where the adjacent underlying dielectric is exposed, in some embodiments. In an embodiment, the removal process is an isotropic etch process, where a high degree of undercut (equal to or greater than a thickness of the underlying conductive material, which may form a space to thickness ration of about 2 to 1, in some embodiments) is created in the conductive material below the patterned masking material.

In some embodiments, the removal process may be an anisotropic etch process, where a low degree of undercut may be achieved. In some embodiments, the degree of undercut may be such that a space to thickness ratio of about 1 to 1 may be achieved.

In an embodiment, the conductive material remains/is not removed from the sidewalls of the embedded interconnect bridge, subsequent to the conductive material removal process. The masking material is then removed, by utilizing any suitable masking material removal technique, whereby the one or more first via is revealed on the first side of the embedded interconnect bridge structure. In an embodiment, the one or more first via may comprise a SEL via structure. The one or more first via is thus formed by a subtractive etch process, where the one or more first via is formed with a tapered profile. The amount of taper (which may be similar to the tapered profiles depicted in FIGS. 1B-1C), may be defined by optimizing the degree of undercut during the etching process. The tapered profile of the one or more first via is advantageous for lithography tools and resist materials, since the tapered profile results in a gradual contrast difference in a particular fiducial pattern. This gradual contrast difference enables pattern search algorithms for exposure processes, and can be tuned by optimizing design bias and chemistry conditions of a particular etch process to facilitate meeting particular overlay and resolution requirements.

At operation 210, a dielectric material may be formed/laminated on the one or more first via. The dielectric material may additionally be formed on the dielectric material adjacent the one or more first via, and on the conductive material disposed on the sidewall of the interconnect bridge. The dielectric material may comprise any suitable dielectric build up material, in some embodiments. In some embodiments, the dielectric material may be planarized such that top surface of the one or more first via and top surfaces of the adjacent dielectric material may be co-planar. In some embodiments, the planarization may be achieved by using a polishing process. In some embodiments, an additional amount of dielectric material may be formed on the planarized surface of the substrate.

At operation 212, at least one opening may be formed in the dielectric material, wherein the at least one opening may expose top portions of the one or more first via. At operation 214, a second via may be formed within the opening. The second via may be formed by forming a conductive material in the opening, such as a plated copper material. The second via may or may not comprise a tapered profile. In an embodiment, a profile of the second via may be a "V" shape (as depicted in FIG. 1E). In an embodiment, the second via may comprise a first level interconnect structure.

Figure 3M:
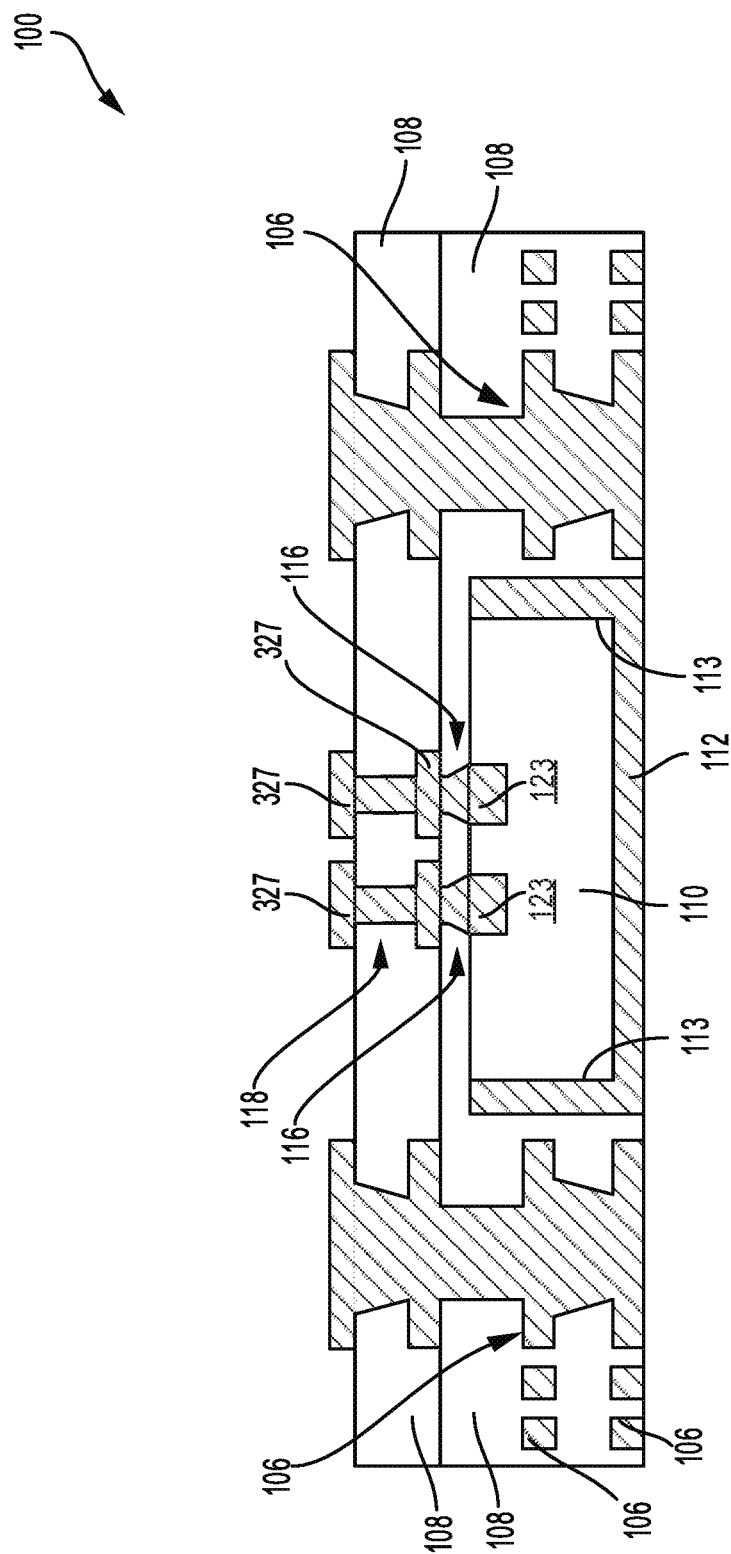

FIGS. 3A-3M depict cross-sectional views of a process of fabricating one or more SEL vias on an embedded interconnect bridge. In FIG. 3A, a portion of a package structure 100 is depicted, where the package structure 100 includes a package substrate 102. The package substrate 102 includes conductive interconnect structures 106 within a dielectric material 108. A conductive trace 112 is on a bottom portion of the package substrate 102, where the conductive trace comprises such conductive materials as copper or copper alloys, nickel, silver, aluminum, zinc or gold, in some embodiments. In FIG. 3B, a dielectric layer 108, such as a build-up layer 108, may be placed/laminated on a top surface of the package structure 100. In an embodiment, the dielectric material 108 may be placed on the package structure 100 by utilizing any suitable lamination process 307.

In FIG. 3C, an opening 315 may be formed within the dielectric material 108. The opening 315 may be formed using any suitable dielectric etch process, and/or a drilling process. In an embodiment, the formation of the opening 315 exposes the conductive trace 112. In an embodiment, the opening 315 possesses a rectangular shape. In FIG. 3D, an interconnect bridge structure 110 is placed on the conductive trace 112, and is embedded within the package substrate 100. The interconnect bridge structure 110 comprises an EMIB structure in some embodiments, and comprises silicon, where one or more routing traces may be disposed within the interconnect bridge structure. The interconnect bridge 110 may comprise one or more conductive pads 123 on a first side 114, and at least partially within a portion of the interconnect bridge. A space 319 may be between sidewalls 113 of the interconnect bridge and an adjacent dielectric layer 108.

In FIG. 3E, a conductive material 112 may be formed on the first side 114 of the interconnect bridge 110, on the sidewalls 113 of the interconnect bridge 110, and on top surfaces 120 of adjacent dielectric material 108. The conductive material 112 may be formed by using a sputtering and/or a plating process 317, such as an electroless or an electrolytic plating process. In some embodiments, the conductive material 112 may comprise copper, copper alloys, gold, silver, or nickel. In some embodiments, the conductive material 112 may be formed to comprise a thickness of between about 3 microns to about 20 microns.

In FIGS. 3F-3G, a masking material 322, such as a dry fil resist, may be formed on the surface of the conductive material 112, and the masking material 322 may be exposed and developed to form patterned features, such as circular pads, by any suitable lithographic process. In an embodiment, the features may be formed to comprise a desired spacing to thickness ratio. The masking material 322 may comprise a dry film resist, in some embodiments. In FIG. 3H, an etching process 323, which may comprise an isotropic etch process in some embodiments, may be used to remove the conductive material 112 from the dielectric surface 120 and from the first side 114 of the interconnect bridge 110 adjacent the patterned masking material 322, while the conductive material 112 remains on the sidewall 113 of the interconnect bridge 110. The one or more SEL vias 116 are formed on the first side 114 of the interconnect bridge 110.

In FIG. 3I, the patterning material 322 may be removed, thus revealing the one or more SEL via 116 on the first side of the interconnect bridge 110. The one or more SEL via 116 may comprise a tapered profile, such as any of those tapered profiles depicted in FIGS. 1B-1C, for example. the one or more SEL via 116 may comprise copper, copper alloys, gold, silver, or nickel, in some embodiments. A particular tapered profile of the one or more SEL via 116 may be chosen for a particular application by optimizing the parameters of the etching process 323. In FIGS. 3J-3K, a dielectric layer 108 may be placed/laminated over the one or more SEL via 116 and over the adjacent dielectric layer 108 surface 120. The dielectric layer 108 may be planarized, utilizing a polishing process, for example, such the top surfaces of the dielectric layer 120 and the one or more SEL vias 116 are polished to be substantially coplanar.

In FIG. 3L, openings 325 in the dielectric 108 may be formed over individual ones of the one or more SEL vias 116 to expose top portions of the SEL vias 116. The openings 325 may be formed using any suitable dielectric etch process. In FIG. 3M, the openings 325 may be filled with the conductive material 112, to form one or more FLI vias, wherein individual ones of the FLI vias 118 are physically and electrically coupled with individual ones of the one or more SEL vias 116. Conductive pads 327 may be formed between the SEL vias 116 and the FLI vias 118, in some embodiments.

Figure 4:
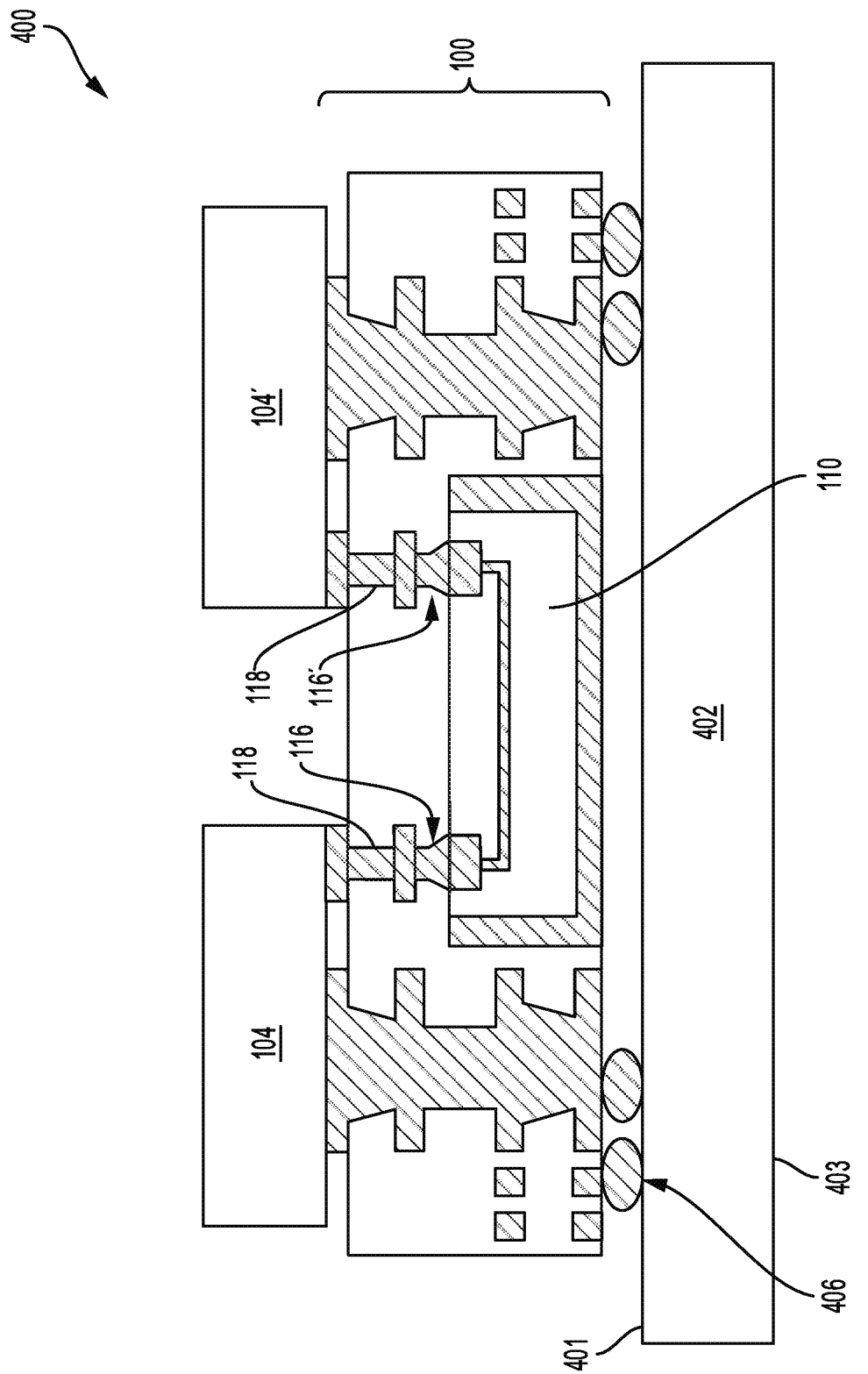
FIG. 4 is a cross-sectional view of a computing system employing packaging structures having subtractive etch vias, in accordance with embodiments.

Turning now to FIG. 4, illustrated is a cross sectional view of a computing system 400. The system 400 includes a mainboard 402 or other circuit board. Mainboard 402 includes a first side 401 and an opposing second side 403, and various components may be on either one or both of the first and second sides 401, 403. In some embodiments, the computing system 400 includes at least one device/package structures 100, and may be a package structure as described in any of the embodiments herein comprising one more SEL via structures 116 on an embedded interconnect bridge 110, such as those depicted in FIG. 1A, for example. FLI via structures 118 may be on the SEL via structures 116. Die 104, 104' may be coupled to each other through the embedded interconnect bridge 110. Joint structures 406 may electrically and physically couple the package structure 100 to the board 402.

System 400 may be any type of computing system, such as, for example, a hand-held or mobile computing device (e.g., a cell phone, a smart phone, a mobile interne device, a music player, a tablet computer, a laptop computer, a net top computer, etc.). However, the disclosed embodiments are not limited to hand-held and other mobile computing devices and these embodiments may find application in other types of computing systems, such as desk-top computers and servers.

Mainboard 402 may be any suitable type of circuit board or other substrate capable of providing electrical communication between one or more of the various components disposed on the board. In one embodiment, for example, the mainboard 402 is a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 402. However, it should be understood that the disclosed embodiments are not limited to the above-described PCB and, further, that mainboard 402 may be any other suitable substrate.

Figure 5:
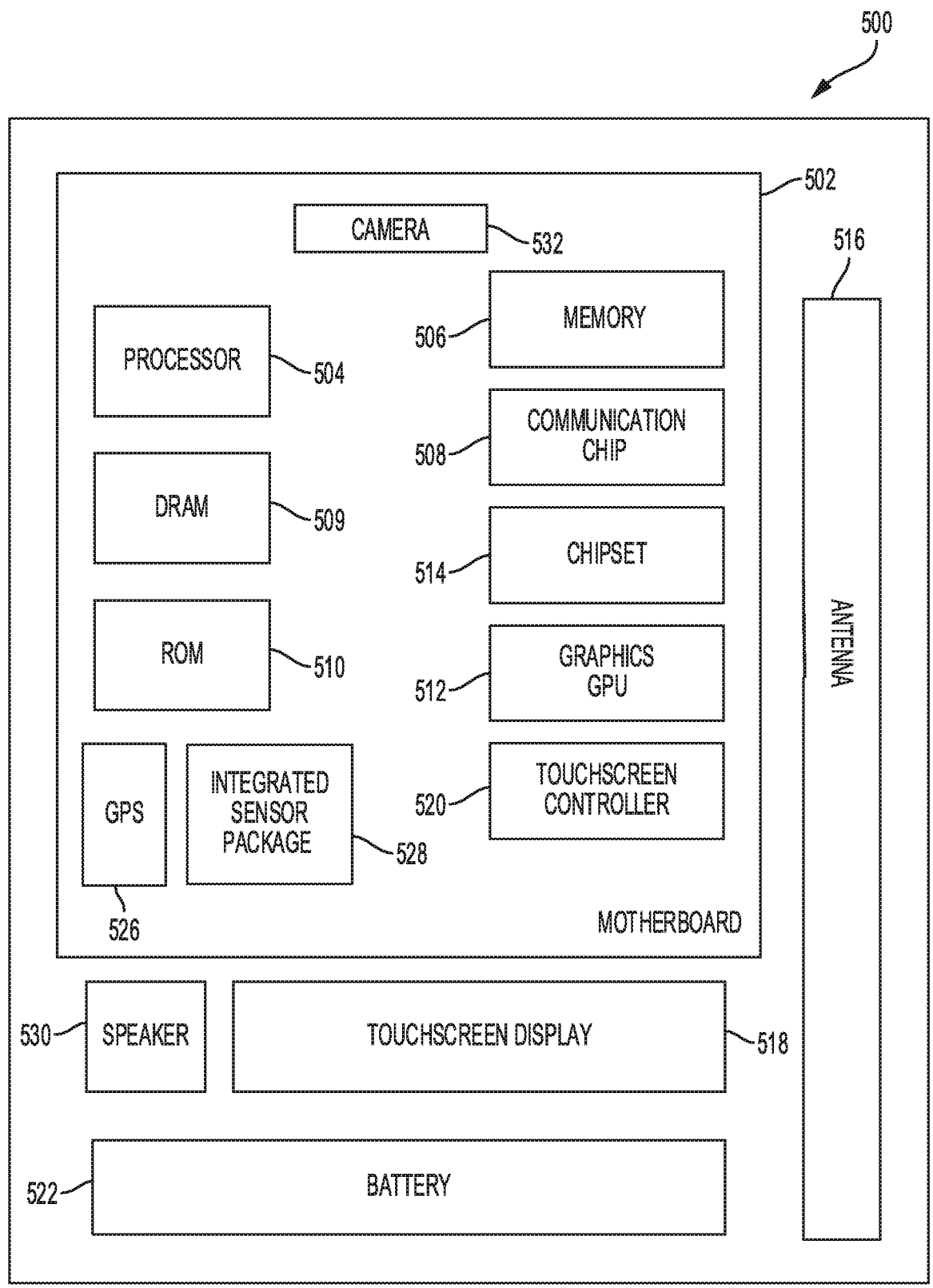
FIG. 5 is a functional block diagram of employing packaging structures having subtractive etch vias, in accordance with embodiments.

FIG. 5 is a schematic of a computing device 500 that may be implemented incorporating the package structures described in any of the embodiments herein comprising SEL via structures on an embedded interconnect bridge, such as those depicted in FIG. 1A, for example. In an embodiment, the computing device 500 houses a board 502, such as a motherboard 502 for example. The board 502 may include a number of components, including but not limited to a processor 504, an on-die memory 506, and at least one communication chip 508. The processor 504 may be physically and electrically coupled to the board 502. In some implementations the at least one communication chip 508 may be physically and electrically coupled to the board 502. In further implementations, the communication chip 508 is part of the processor 504.

Depending on its applications, computing device 500 may include other components that may or may not be physically and electrically coupled to the board 502, and may or may not be communicatively coupled to each other. These other components include, but are not limited to, volatile memory (e.g., DRAM) 509, non-volatile memory (e.g., ROM) 510, flash memory (not shown), a graphics processor unit (GPU) 512, a chipset 514, an antenna 516, a display 518 such as a touchscreen display, a touchscreen controller 520, a battery 522, an audio codec (not shown), a video codec (not shown), a global positioning system (GPS) device 526, an integrated sensor 528, a speaker 530, a camera 532, an amplifier (not shown), compact disk (CD) (not shown), digital versatile disk (DVD) (not shown), and so forth). These components may be connected to the system board 502, mounted to the system board, or combined with any of the other components.

The communication chip 508 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments herein are not limited to the embodiments so described, but can be practiced with modification and alteration without departing from the scope of the appended claims.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should, therefore, be determined with reference to the appended claims, along with the full scope of equivalents to which such claims are entitled.

What is claimed is:

1. A package structure comprising:
one or more layers of dielectric material;
an embedded substrate within the dielectric material; and
one or more via structures each in direct contact with an
external side of a corresponding pad of the embedded substrate on a first side of the embedded substrate, the external side facing away from the embedded substrate, wherein individual ones of the via structures comprise a conductive material and have a tapered profile, and wherein the individual ones of the via structures comprise a first portion and a second portion, wherein the first portion is on the embedded substrate, and the second portion is on the first portion, and wherein a lateral width of the first portion is greater than a lateral width of the second portion.

2. The package structure of claim 1, wherein the conductive material is also on a sidewall of the embedded substrate.

3. The package structure of claim 1, wherein individual ones of the via structures comprise a first via structure, and wherein the package structure further comprises one or more second via structures, wherein individual ones of the second via structure have a first portion and a second portion, wherein the first portion of the second via is on the first via structure, and the second portion of the second via structure is on the first portion of the second via structure, wherein the second portion of the second via structure has a lateral width that is greater than a lateral width of the first portion of the second via structure.

4. The package structure of claim 3, wherein the second via is above the first via, and where two or more pads are coupled to each other by a trace within the embedded substrate.

5. The package structure of claim 1, further comprising a third portion, wherein the third portion is on the second portion, wherein the third portion has a greater lateral width than the second portion.

6. The package structure of claim 1, wherein the lateral width of the first portion is at least 10 percent greater than the lateral width of the second portion.

7. The package structure of claim 1, wherein a diameter of individual ones of the via structure is between 2 microns and 50 microns, a height of individual ones of the via structures is between 3 microns and 20 microns, and a space between adjacent individual ones of the via structures is between 25 to 35 microns.

8. The package structure of claim 1, wherein a ratio of a space between adjacent individual ones of the via structures and a height of adjacent individual ones of the via structures is at least 2:1.

9. The package structure of claim 1, further comprising a first die and a second die adjacent the first die, wherein the first die and the second die are electrically coupled to the one or more via structures.

10. A package structure comprising:
a substrate comprising one or more layers of dielectric material;
an embedded interconnect bridge within the dielectric material;
one or more first tapered interconnect structures each coupled to an external side of a corresponding pad of the embedded substrate on a first region of a first side of the embedded interconnect bridge;
one or more second tapered interconnect structures each in direct contact with an external side of a corresponding pad of the embedded substrate on a second region of the first side of the embedded interconnect bridge, the external side facing away from the embedded interconnect bridge, wherein individual ones of the first and second tapered interconnect structures comprise a first portion and a second portion, wherein a lateral width of the first portion is at least about 10 percent greater than a lateral width of the second portion, and wherein the first portion is on the first side of the embedded interconnect bridge, and the second portion is on the first portion;
a first die coupled to the one or more first tapered interconnect structures on the first region; and
a second die coupled to the one or more second tapered interconnect structures on the second region.

11. The package structure of claim 10, wherein a conductive lining is on a sidewall of the embedded interconnect bridge.

12. The package structure of claim 10, wherein the conductive lining comprises a thickness of 3 to 20 microns.

13. The package structure of claim 10, wherein the conductive lining is between the sidewall of the embedded interconnect bridge and a dielectric material adjacent the embedded interconnect bridge.

14. The package structure of claim 10, wherein a first portion of a footprint of the first die is adjacent the interconnect bridge and a second portion of the footprint of the first die is over the embedded interconnect bridge.

15. The package structure of claim 10, wherein a conductive trace is on a second side of the embedded interconnect bridge.

16. The package structure of claim 10, wherein a space between adjacent individual ones of the first and second tapered interconnect structures is greater than about twice a height of individual ones of the tapered interconnect structures.

17. The package structure of claim 10, wherein the first die and the second die are electrically coupled to each other through one or more first tapered interconnect structures and one or more second tapered interconnect structures.

* * * * *